United States Patent [19]

Brault

[11] Patent Number: 4,688,237

[45] Date of Patent: Aug. 18, 1987

[54] DEVICE FOR GENERATING A FRACTIONAL FREQUENCY OF A REFERENCE FREQUENCY

[75] Inventor: Roland Brault, Antony, France

[73] Assignee: Thomson-CSF, France, France

[21] Appl. No.: 671,092

[22] Filed: Nov. 13, 1984

[30] Foreign Application Priority Data

Nov. 15, 1983 [FR] France ................................ 83 18134

[51] Int. Cl.$^4$ ............................................. H03K 21/00
[52] U.S. Cl. ...................................... 377/48; 328/15; 328/20; 307/271; 307/219.1; 330/109
[58] Field of Search .................... 328/15, 16, 20, 21, 328/23, 223, 113; 307/520, 521, 271, 219.1; 330/80, 106, 109; 377/47, 48

[56] References Cited

U.S. PATENT DOCUMENTS

| | | | |
|---|---|---|---|
| 1,823,687 | 9/1931 | Heising | 328/15 |
| 2,162,806 | 6/1939 | Fay | 328/16 |
| 2,748,283 | 5/1956 | Merrill et al. | 377/47 |
| 2,868,977 | 1/1959 | Hahnel | 331/170 |
| 2,926,244 | 2/1960 | Stryker, Jr. | 328/15 |
| 2,939,000 | 5/1960 | Krugman | 331/109 |
| 3,156,872 | 11/1964 | Tongue | 330/80 |
| 3,181,070 | 4/1965 | Robuck | 328/23 |
| 3,335,290 | 8/1967 | Fischman et al. | 328/20 |
| 3,337,817 | 8/1967 | McGeogh et al. | 331/158 |
| 3,354,325 | 11/1967 | Isborn | 377/118 |
| 3,446,947 | 5/1969 | Overstreet, Jr. | 377/48 |
| 3,958,187 | 5/1976 | Suzuki et al. | 307/269 |
| 4,328,484 | 5/1982 | Denecke | 377/47 |

FOREIGN PATENT DOCUMENTS 3147222 8/1983 Fed. Rep. of Germany.

OTHER PUBLICATIONS

"Low Frequency Oscillator Uses Subharmonic Sync", by Donald F. Dekold, Electronics, vol. 44, No. 18, Aug. 30, 1971, pp. 48 and 49.
"A Stables: Logic Gate Circuits", by P. Williams, Wireless World, vol. 86, No. 1529, Jan. 1980, pp. 92 and 93.
"Synthese De Frequence Par Verrouillage Survne Harmonique", Electronique et Applications Industrielles, No. 250, Apr. 1978, p. 65.
"Electronic Circuits Digital and Analog", by Charles Holt, copyright 1978, by John Wiley & Sons, p. 806.

Primary Examiner—Stanley D. Miller
Assistant Examiner—K. Ohralik
Attorney, Agent, or Firm—Cushman, Darby & Cushman

[57] ABSTRACT

A device for generating clock signals at different frequencies and in particular a fractional frequency of a reference frequency comprises a reference frequency generator which delivers at the output a reference signal having a frequency f, a frequency-divider for dividing by an integer p which delivers a signal at the frequency f/p at the output, and a digital inverter for extracting the harmonic frequency of order n and delivering a signal at a multiple frequency in order to obtain at the output of the device a signal of digital type having the frequency n/pf. A feedback loop impedance is coupled to the input and output of the inverter and preferably has a maximum value at the frequency nf. A load impedance is coupled to the input of the inverter and preferably has a minimum value at the frequency nf.

24 Claims, 11 Drawing Figures

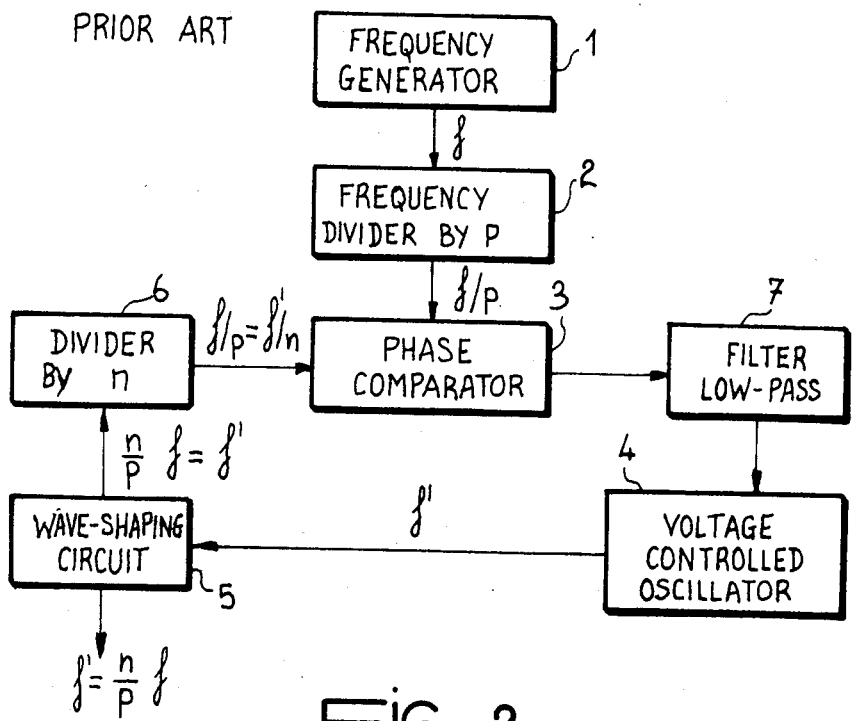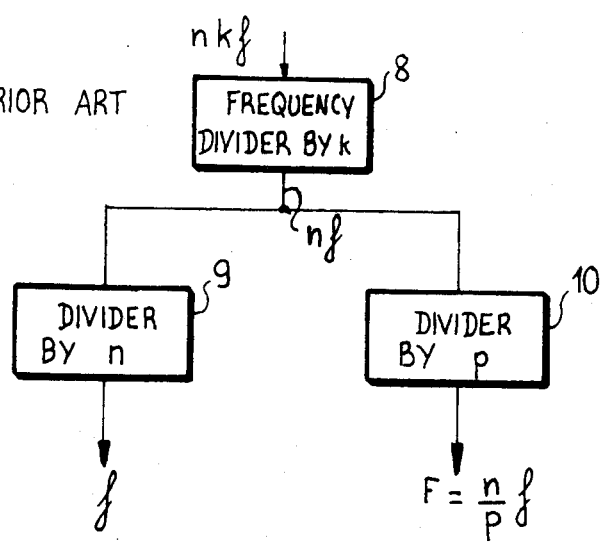

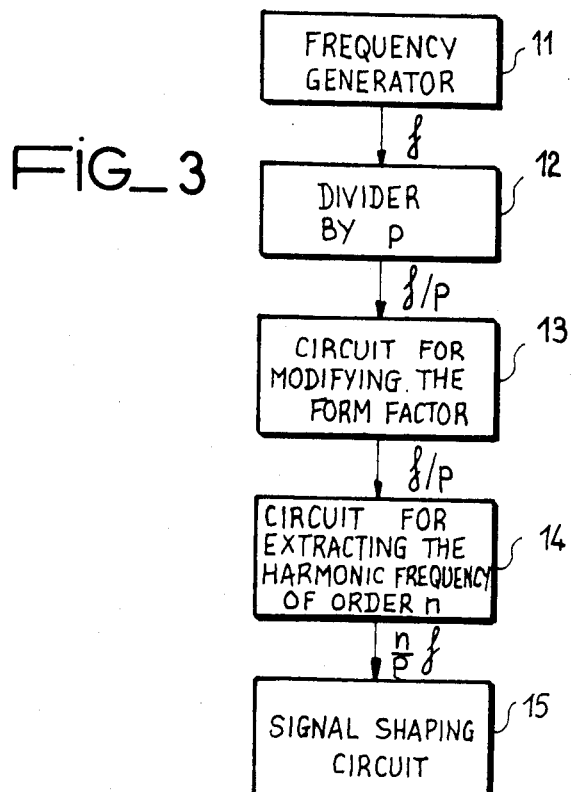
FIG_3
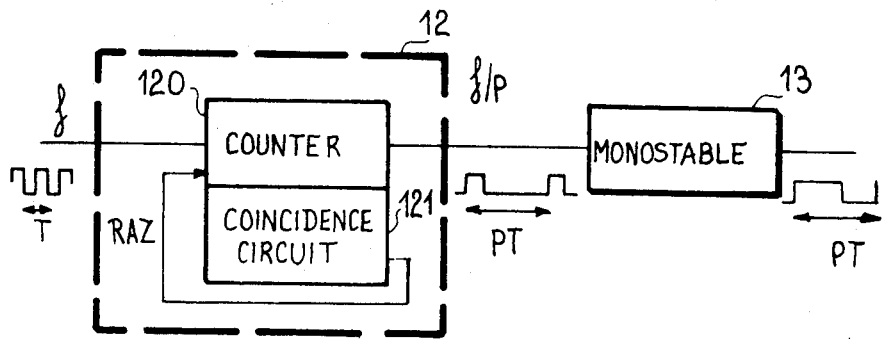
FIG_4

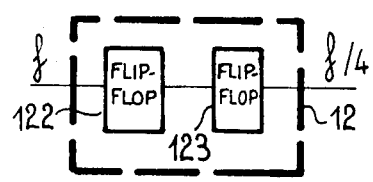
FIG_5
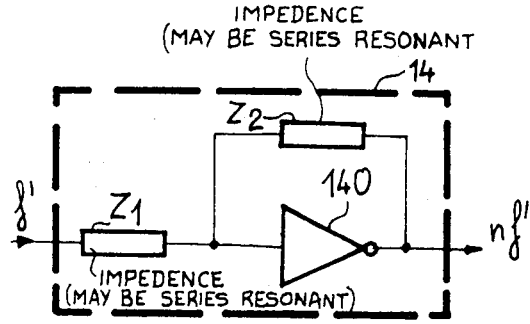
FIG_6
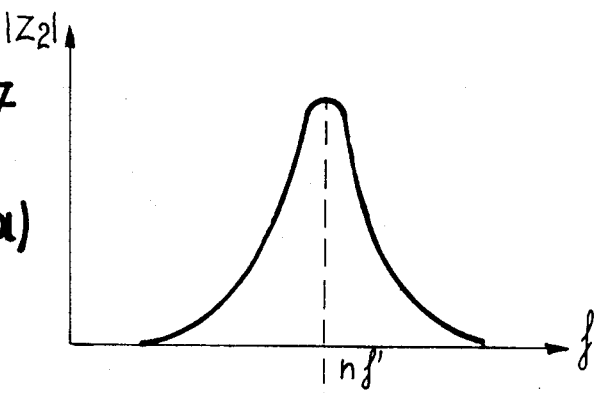
FIG_7
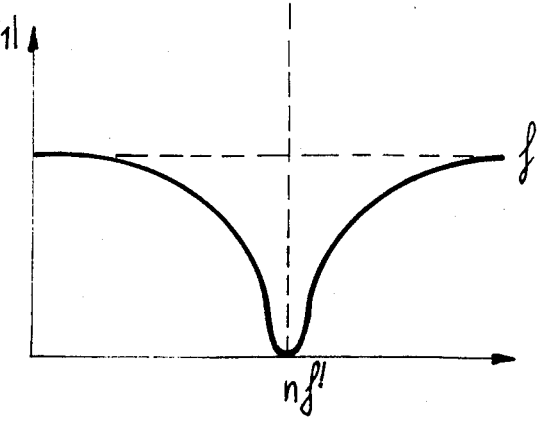

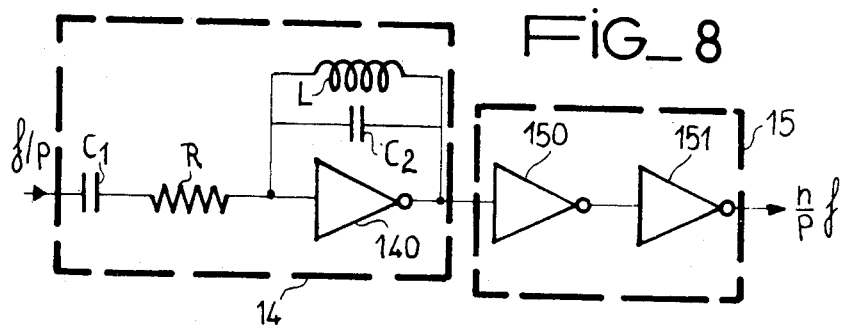
FIG_8
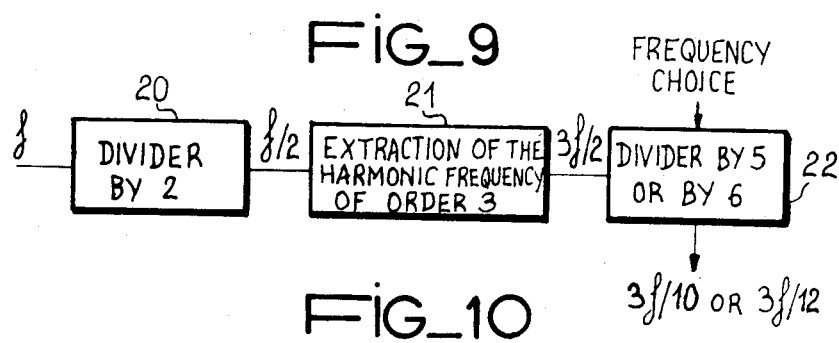
FIG_9
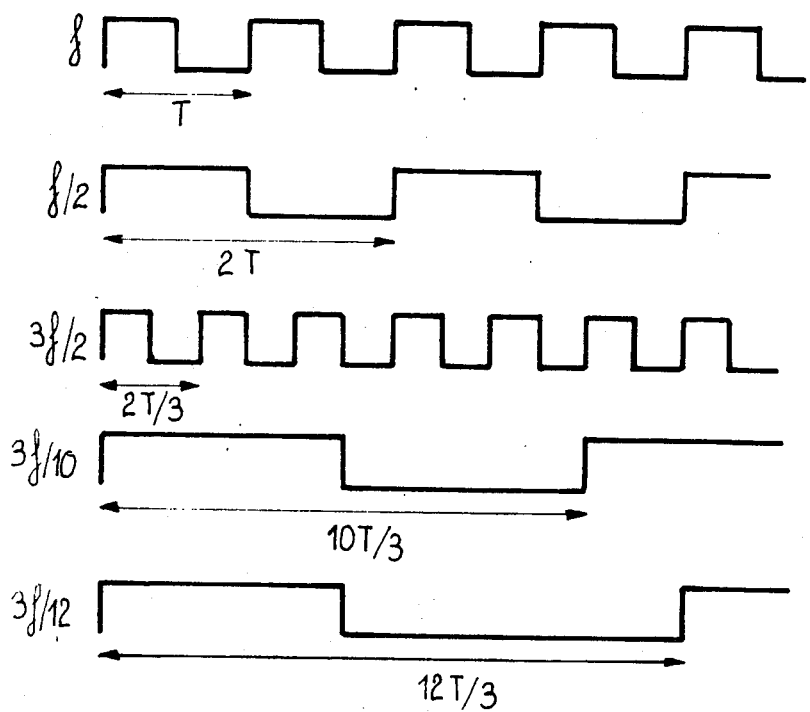
FIG_10

DEVICE FOR GENERATING A FRACTIONAL FREQUENCY OF A REFERENCE FREQUENCY

BACKGROUND OF THE INVENTION

Field of the Invention

This invention relates to a device for generating a fractional frequency of a reference frequency, that is, a device for generating a frequency (n/p)f from a frequency f in which n and p are integers.

Devices of this type are employed in particular in digital electronic systems. In fact, these systems usually require a series of clock signals and synchronization signals having predetermined frequency and phase relationships. In point of fact, the frequencies of clock signals to be generated are not always integral multiples or submultiples of the reference clock signal. However, in the majority of cases, the frequencies of the clock signals to be generated are fractions of the reference clock frequency and are given by the following equation:

$$F=(n/p)f$$

where f is the reference clock frequency and n and p are integers greater than or equal to 1.

Description of the Prior Art

There at present exist a number of different solutions for obtaining a frequency F=(n/p)f from a frequency f.

Among these solutions, those which are in most common use are the phase-locked loop and the LCM (lowest common multiple) frequency.

As shown in FIG. 1, the phase-locked loop is constituted in known manner by a generator 1 for producing a frequency f, the output of which is connected to a frequency divider 2 for dividing by the integer p in order to obtain a signal having a frequency f/p which is sent to one of the inputs of a phase comparator 3. Said loop also comprises a voltage-controlled oscillator 4 which delivers a signal having a frequency f' and which, after digitization within the circuit 5, is introduced into a frequency divider 6 which divides by the integer n. The signal f'/n at the output of the divider 6 is sent to the other input of the phase comparator 3 which delivers at the output a signal containing in particular $|f'/n-f/p|$. This signal is sent to a low-pass filter 7 in order to obtain at the output solely the signal which is representative of the error and controls the oscillator 4, thereby modifying the frequency f'. In this case, since the loop is closed, we have f/p=f'/n, whence f'=(n/p)f.

It is thus possible to obtain at the output of the waveshaping circuit a clock signal having the frequency f'=(n/p)f.

However, the phase-locked loop has the disadvantage of being formed by circuits of the analog type entailing the need for supply voltages which are different from the single supply voltage required for the digital circuits.

The other conventional solution lies in the use of the LCM frequency.

The device which permits the use of this frequency is of simple design and has recourse to digital circuits. In fact, as shown in FIG. 2, the device is essentially constituted by three frequency dividers, namely a first divider 8 which utilizes the LCM frequency n k f of the frequencies to be generated in order to carry out a first division by the integer k. The device is then constituted by two dividers 9, 10 which are mounted in parallel and divide respectively the frequency n f obtained at the output of the divider 8 by the integer n in order to obtain the reference frequency f and by the integer p in order to obtain the fractional frequency (n/p)f. However, when using this device, the LCM frequency of the frequencies to be generated must be available whereas this is not always possible.

SUMMARY OF THE INVENTION

The object of the present invention is therefore to overcome these disadvantages by providing a new and novel device for generating a fractional frequency of a reference frequency which utilizes only circuits of the digital type and a minimum number of discrete components in order to generate the fractional frequency from existing control signals, in particular from the signal at the reference frequency.

In consequence, the present invention is directed to a device for generating a fractional frequency of a reference frequency. Said device essentially comprises by a reference frequency generator which delivers at the output a reference signal having a frequency f, a frequency divider for dividing by an integer p which delivers a signal at the frequency f/p at the output. Another feature of the device is that it comprises digital means for extracting the harmonic frequency of order n and delivering a signal at a multiple frequency in order to obtain at the output of said device a signal of digital type having a frequency (n/p)f. Said digital means comprise a digital inverter, a feedback loop impedance connected between the output and the input of the digital inverter and a load impedance connected at the input of the digital inverter. The feedback loop and load impedances are selected with a view to ensuring that at least the feedback loop impedance has a maximum value or the load impedance has a minimum value at the frequency (n/p)f. of the harmonic frequency to be extracted.

The structure of the device described in the foregoing is the most general structure.

However, if the output frequency is of the form n f, that is to say if p=1, the device described in the foregoing is not provided with a divider.

BRIEF DESCRIPTION OF THE DRAWINGS

Other features of the invention will be more apparent upon consideration of the following description and accompanying drawings, wherein:

FIG. 1 is a block diagram of a phase-locked loop in accordance with the prior art;

FIG. 2 is a block diagram of a device which makes use of the LCM frequency of the frequencies to be generated in accordance with the prior art;

FIG. 3 is a block diagram of a device for generating a fractional frequency of a reference frequency in accordance with the present invention;

FIG. 4 illustrates one embodiment of the frequency divider of the device shown in FIG. 3;

FIG. 5 illustrates another embodiment of the frequency divider of the device shown in FIG. 3;

FIG. 6 illustrates a general embodiment of the means for extracting the harmonic frequency of order n which is employed in the device of FIG. 3;

FIGS. 7a and 7b represents two curves which explain the operation of the circuit of FIG. 6;

FIG. 8 illustrates a detailed embodiment of the means for extracting the harmonic frequency of order n employed in the device of FIG. 3;

FIG. 9 is a block diagram of one mode of utilization of the device shown in FIG. 3;

FIG. 10 is a waveform diagram showing the frequencies as a function of time at the output of the different circuits which constitute the embodiment of FIG. 9.

DESCRIPTION OF THE PREFERRED EMBODIMENTS

FIGS. 1 and 2 have already been described in the introductory part of this specification.

As shown in the block diagram of FIG. 3, the device for generating a fractional frequency of a reference frequency in accordance with the invention mainly comprises by a frequency generator 11, a frequency divider 12 for dividing by an integer, if necessary a circuit 13 for modifying the form factor, a circuit 14 for extracting the harmonic frequency of order n, and a circuit 15 for shaping the signal and producing at the output a signal of digital type at the desired fractional frequency.

The frequency generator 11 usually comprises the reference clock of the digital system in which the device in accordance with the present invention is employed. Said generator 11 generates at the output a clock signal of digital type and having a frequency f. However, the device in accordance with the present invention can also be employed for generating a signal of digital type from a sine-wave analog signal, in which case the frequency generator 11 is a generator for producing a sine-wave signal having a frequency f.

The signal having a frequency f is sent into a frequency divider 12 for dividing by an integer so as to obtain at the output a signal at the frequency f/p. Different types of frequency dividers may be employed.

As illustrated in FIG. 4, the frequency divider 12 comprises a counter 120 which performs an incrementation of one unit at each clock cycle and will automatically be reset to zero by means of a coincidence circuit 121 when said counter has performed p incrementations, where p is the division ratio. At each zero-reset, the counter will deliver a pulse having the frequency f/p at the output. In the case of a sine-wave signal, the counter will be preceded by a wave-shaping circuit. Furthermore, in order to obtain, in the signal of frequency f/p, a high harmonic content which is subsequently to be extracted, it is possible according to the value of the integer p to modify the form factor of the signal or in other words the time-duration in state 1 with respect to the time-duration in state 0 of the digital-type signal of frequency f/p which is obtained at the output of the divider. As shown in FIG. 4, this form-factor modification circuit 13 can comprise a monostable multivibrator.

In another embodiment, the divider circuit 12 can be formed by a down-counter which is loaded to the value p, then performs on the basis of this value a decrementation of one unit at each clock cycle until the zero value is reached. When the counter attains the zero value, it delivers a pulse at the frequency f/p while a control circuit re-initializes the counter at the value p at the same time.

In yet another embodiment which is shown in FIG. 5 and in the case in particular in which the integer p is an integral power of 2, the frequency divider 12 can be constructed by making use of bistable multivibrators or flip-flops. Thus in the case of a division by 4, the divider 12 comprises two flip-flops 122 and 123 mounted in series.

The signal of digital type and of frequency f/p, as obtained at the output of the frequency divider 12 or alternately at the output of the circuit 13 for modifying the form factor, is transmitted to the circuit 14 for extracting the harmonic frequency of order n.

As shown in FIG. 6, the circuit 14 essentially comprises an inverter 140 of digital type. Between the output and the input of the digital inverter 140 is connected a feedback loop impedance Z 2 which makes it possible, in particular, to position the operating point of the digital inverter in the transition zone. Furthermore, a load impedance Z 1 is connected in series between the input of the circuit 14 and the input of the digital inverter 140.

Different types of circuits can be employed for providing the impedance Z 2 and the impedance Z 1. The only condition which must be satisfied is that the impedance Z 2 must have a maximum value in respect of the harmonic frequency which it is desired to extract and/or that the impedance Z 1 must have a minimum value in respect of the harmonic frequency to be extracted. Thus, as shown in FIG. 8, the impedance Z 2 can comprise a resonant circuit comprising an inductance coil L mounted in parallel with a capacitor $C_2$. The values of inductance and capacitance chosen for the coil L and the capacitor $C_2$ are such that the harmonic frequency of order n, namely n f' in the case of FIG. 6 or (n/p)f in the case of FIG. 8, satisfies the following equation:

$$n f' = \frac{n}{p} f = \frac{1}{2\pi \sqrt{L C_2}} \quad \text{(see FIG. 7a).}$$

As shown in FIG. 8, the impedance Z 1 can comprise a resistor R. However, said impedance Z 1 can also be provided by a series oscillating circuit having a minimum value of impedance at the harmonic frequency n f' as shown in FIG. 7b. In addition, a capacitor $C_1$ is provided upstream of the impedance Z 1 in order to transmit only the alternating-current component of the input signal to the circuit 14 for extraction of the harmonic frequency of order n and thus to ensure that the operation of the inverter is not disturbed.

In regard to the circuit 14, a comparison can be made between the operation of this circuit and that of a filter by analogy with linear circuits such as operational amplifiers.

In the embodiment shown in FIG. 8, filtering of the harmonic frequency of order n is obtained by means of the resonant circuit L $C_2$ which oscillates at the desired harmonic frequency as described in the foregoing. Filtering of the harmonic frequency of order n can also be performed by the impedance Z 1 when this latter comprises a series oscillating circuit.

The circuit arrangement of FIG. 8 may or may not be self-oscillating. This will depend on different characteristics such as the slope of the transfer function of the inverter 140 at the bias point, on the quality factor of the oscillating circuit L $C_2$ or on the ratio of the value of the impedance of the circuit L $C_2$ to the value of impedance Z 1, namely of the resistor R at the resonance frequency.

When the circuit is self-oscillating, the oscillation thus produced is synchronized by the harmonic frequency of order n contained in the input signal. When the circuit is of the damped-oscillation type, oscillation at the harmonic frequency is re-excited by the harmonic frequency.

However the signal obtained at the output of the circuit 14 is a signal of sinusoidal waveform which may or may not be clipped.

If the signal at the input of the circuit 14 is of high strength, it is possible to obtain at the output a highly clipped signal, that is to say a pseudo-digital signal. However, in the majority of cases, the signal obtained at the output of the circuit 14 will be introduced into a wave-shaping circuit 15 comprising as shown in FIG. 8, a plurality of digital inverters 150, 151 for obtaining at the output a signal of digital type at the frequency n f/p. The operating point of the inverters 150 and 151 is established by the inverter 140. The gain of each inverter makes it possible to obtain signals which are exactly of the digital type at the output of the device.

When n and p have high values and when it is possible to break down the ratio n/p to the following form : $n/p = n_1 \cdot n_2 \, n_3 \ldots / p_1 \cdot p_2 \cdot p_3 \ldots$ where $n_i$ and $p_i$ are integers of relatively small value, the device for generating a fractional frequency of a reference frequency in accordance with the present invention in that case comprises an array of series-connected cells each essentially comprising a frequency-divider for dividing by an integer $p_i$ and means for extracting the harmonic frequency of order $n_i$ in such a manner as to ensure that each cell is adapted to $n_i/p_i$.

Referring now to FIGS. 9 and 10, the following description relates to one mode of utilization of the device in accordance with the invention for generating a fractional frequency of a reference frequency.

As shown in FIG. 9, it is desired to obtain a fractional frequency 2/3f. This fractional frequency is subsequently employed for the purpose of obtaining two different fractional frequencies, namely a frequency 3f/10 or a frequency 3f/12. In consequence, the device in accordance with the present invention comprises a scale-of-two frequency-divider 20 which produces at the output a signal having a frequency f/2, and by means 21 for extracting the harmonic frequency of order 3 which produces at the output a digital signal having a frequency 3f/2 as shown in FIG. 10. The digital signal of frequency 3f/2 is then sent into a programmable frequency-divider 22 which is capable of dividing the frequency by 5 or by 6 in order to obtain the frequency 3f/10 or the frequency 3f/12 according to the value 5 or 6 entered in the divider 22. In practice, this device has been employed for obtaining digital signals which have a frequency of 9 MHz or 7.5 MHz and are synchronous with a clock signal at 30 MHz.

Thus it is possible with the device hereinabove described to resort solely to the use of circuits of the digital type in order to generate a fractional frequency of a reference frequency, that is to say the reference clock frequency, in the majority of instances. The digital circuits employed are of a conventional type in digital technology, namely TTL circuits, CMOS circuits or the like.

In the foregoing description, reference has been made to a frequency-divider for dividing by a fixed number. However, as will be apparent to those versed in the art, a programmable frequency-divider may be employed if necessary in order to obtain at the output of the device a digital signal having a frequency (n/p)f in which p can be modified if the need arises. Furthermore, in the case of a division by 1, the frequency-divider is omitted in the device described in the foregoing.

It should be mentioned in addition that the device in accordance with the invention can be employed for generating the LCM frequency of the different frequencies which it may be desired to employ in a digital system.

What is claimed is:

1. Apparatus for generating a plurality of fractional frequencies of a reference signal having a frequency f, comprising:
   first divider means, adapted to receive said reference signal, for dividing said reference signal frequency by an integer m, and for providing a divided signal having a frequency f/m;
   extraction means, coupled to said divider means, for extracting a harmonic frequency of order n, n being an integer, and for providing a digital output signal having a frequency (nf)/m; and
   second divider means, coupled to said extraction means, for dividing said digital output signal by an integer p or an integer q to provide either a first digital signal having a frequency (nf)/(mp), or a second digital signal having a frequency (nf)/(nq).

2. Apparatus according to claim 1 wherein said second divider means includes a programmable frequency-divider.

3. Apparatus according to claim 1 wherein said extraction means includes:
   a digital inverter having an input and an outut;
   a feedback loop impedance coupled to said inverter input and output, said loop impedance having a maximum value at the frequency (nf)/m; and
   a load impedance coupled to said inverter input.

4. Apparatus according to claim 3 wherein said load impedance has a minimum value at the frequency (nf)/m.

5. Apparatus according to claim 1 wherein said extraction means includes:
   a digital inverter having an input and an outut;
   a feedback loop impedance coupled to said inverter input and output; and
   a load impedance coupled to said inverter input and having a minimum value at the frequency (nf)/m.

6. Apparatus according to claim 5 wherein said feedback loop impedance has a maximum value at the frequency (nf)/m.

7. Apparatus for generating a digital clock signal at a fractional frequency of a reference signal, comprising:
   reference signal generating means for generating said reference signal with a frequency f;
   frequency-divider means for dividing said reference signal frequency by an integer p to obtain a digital signal having a frequency f/p; and
   extracting means for extracting a harmonic frequency of order n from said digital signal, n being an integer, and for providing a digital output signal having a frequency (nf)/p said extracting means including (a) a digital inverter having an input and an output, (b) a feedback loop impedance coupled to said inverter input said loop impedance having a maximum value at the frequency (nf)p and (c) a load impedance interposed in the feed path of said inverter input.

8. Apparatus according to claim 7, wherein said feedback loop impedance includes a resonant circuit having a resonance frequency which corresponds to the harmonic frequency.

9. Apparatus according to claim 7, wherein said load impedance includes a resistor.

10. Apparatus according to claim 7, wherein the load impedance includes a series oscillating circuit in which the oscillation frequency corresponds to said harmonic frequency.

11. Apparatus according to claim 7, further including signal-shaping means coupled to an output of said extracting means.

12. Apparatus according to claim 7, wherein said signal-shaping means includes a digital inverter.

13. Apparatus according to claim 7, further including means for modifying the form factor of the signal obtained at an outpput of said frequency-divider means.

14. Apparatus according to claim 7, wherein said frequency-divider means includes means for modifying the value of the integer p.

15. Apparatus according to claim 7, wherein said reference signal is digital.

16. Apparatus according to claim 7 wherein said load impedance has a minimum value at the frequency nf.

17. Apparatus for generating a digital clock signal at a fractional frequency of a reference signal, comprising:
reference signal generating means for generating said reference signal with a frequency f;
frequency-divider means for dividing said reference signal frequency by an integer p to obtain a digital signal having a frequency f/p;
means for modifying a form factor of the signal obtained at an output of said frequency-divider means; and
extracting means for extracting a harmonic frequency of order n from said digital signal, n, being an integer, and for providing a digital output signal having a frequency (nf)/p, said extracting means including (a) a digital inverter having an input and an output, (b) a feedback loop impedance coupled to said inverter input and output, said loop impedance having a maximum value at the frequency (nf)/p, and (c) a load impedance interposed in the feed path of said inverter input.

18. Apparatus for generating a digital clock signal at a fractional frequency of a reference signal, comprising:
a reference signal generating means for generating said reference signal with a frequency f;
frequency-divider means for dividing said reference signal frequency by an integer p to obtain a digital signal having a frequency f/p; and
extracting means, coupled to said reference signal generating means, for extracting harmonic frequency of order n from said reference signal, n being an integer, and for providing a digital output signal having a frequency nf, said extracting means including (a) a digital inverter having an input and an output, (b) a feedback loop; impedance coupled to said inverter input and output, and (c) a load impedance interposed in the feed path of said inverter input and having a minimum value at the frequency nf.

19. Apparatus according to claim 18 wherein said feedback loop impedance has a maximum value at the frequency nf.

20. Apparatus according to claim 18 wherein said feedback loop impedance includes a resonant circuit having a resonance frequency which corresponds to the harmonic frequency.

21. Apparatus according to claim 18 wherein said load impedance includes a series oscillating circuit in which the oscillation frequency corresponds to said harmonic frequency.

22. Apparatus according to claim 18 further including signal-shaping means coupled to an output of said extracting means.

23. Apparatus according to claim 18 further including means for modifying the form factor of the signal obtained at an output of said frequency-divider means.

24. Apparatus for generating a digital clock signal at a fractional frequency of a reference signal, comprising:
reference signal generating means for generating said reference signal with a frequency f;
frequency-divider means for dividing said reference signal frequency by an integer p to obtain a digital signal having a frequency f/p;
means for modifying a form factor of the signal obtained at an output of said frequency-divider means; and
extracting means, coupled to said reference signal generating means, for extracting a harmonic frequency of order n from said reference signal, n being an integer, and for providing a digital output signal having a frequency nf, said extracting means including (a) a digital inverter having an input and an output, (b) a feedback loop impedance coupled to said inverter input and output, and (c) a load impedance interposed in the feed path of said inverter input and having a minimum value at the frequency nf.

* * * * *